United States Patent [19]

Yamada et al.

[11] Patent Number: 4,492,975

[45] Date of Patent: Jan. 8, 1985

[54] GATE TURN-OFF THYRISTOR STACK

[75] Inventors: Yukio Yamada; Hiroshi Itahana; Hisashi Kuwana, all of Katsuta, Japan

[73] Assignee: Hitachi, Ltd., Tokyo, Japan

[21] Appl. No.: 396,377

[22] Filed: Jul. 8, 1982

[30] Foreign Application Priority Data

Jul. 10, 1981 [JP] Japan .................. 56-107100

[51] Int. Cl.³ .................. H01L 23/32; H01L 23/42; H01L 25/04; H03K 17/60
[52] U.S. Cl. .................. 357/76; 357/79; 357/82; 307/252 C; 307/252 T
[58] Field of Search .................. 357/76, 82, 74, 75, 357/79; 363/161; 307/252 C, 252 T, 252 K, 252 L

[56] References Cited

U.S. PATENT DOCUMENTS

| 3,447,118 | 5/1969 | Ferree | 357/76 |
| 3,471,757 | 10/1969 | Sias | 357/74 |
| 3,496,445 | 2/1970 | Boksjo et al. | 357/76 |
| 3,584,287 | 6/1971 | Binoche | 357/76 |
| 3,753,052 | 8/1973 | Rosser | 357/76 |
| 4,177,479 | 12/1979 | DeBruyne et al. | 307/252 C |
| 4,203,040 | 5/1980 | Abbondanti et al. | 307/252 T |

FOREIGN PATENT DOCUMENTS 1384175 2/1975 United Kingdom .................. 363/161

Primary Examiner—Andrew J. James
Assistant Examiner—John LaMont
Attorney, Agent, or Firm—Antonelli, Terry & Wands

[57] ABSTRACT

A GTO thyristor stack comprises a pair of GTO thyristors in parallel connection and a pair of diodes in anti-parallel connection therewith. The elements in one of the GTO thyristor pair and the diode pair are located in the middle of the stack structure and sandwiched by the elements in the other with all the elements stacked in electrical connection. The stack structure is clamped by a pair of clamper members.

5 Claims, 8 Drawing Figures

4,492,975

GATE TURN-OFF THYRISTOR STACK

This invention relates to an improvement in a gate turn-off (hereinafter referred to as GTO) thyristor stack comprised of GTO thyristors in parallel connection.

Recently, the GTO thyristor having self-turn off capability has been gaining in popularity, and its application to power conversion devices such as converters, inverters, choppers or cyclo-converters has been extending. However, the GTO thyristor has inherent difficulties in increasing its current capacity and it is general to use two GTO thyristors in parallel connection to provide sufficient current handling capability.

Another problem encountered in a circuit utilizing GTO thyristors is that wiring inductance must be minimized to assure the self-turn off function of the GTO thyristor. As the capacity increases, this problem becomes more difficult to solve.

This accounts for the fact that when the GTO thyristors are used, for example, to construct a PWM (pulse width modulation) inverter adapted to drive an induction motor, the distance between these GTO thyristors in parallel connection and circuit parts associated therewith must be so designed as to be minimized.

It is therefore an object of this invention to provide a GTO thyristor stack capable of reducing in size two GTO thyristor circuits in parallel connection each having a GTO thyristor and a diode in anti-parallel connection therewith, thereby minimizing wiring inductance of the circuits.

According to this invention, there is provided a gate turn-off thyristor stack comprising a pair of flat type gate turn-off thyristor elements to be connected in parallel with each other and a pair of flat type diode elements to be connected in direct parallel with the respective gate turn-off thyristor elements, wherein all the elements are stacked with electrical connection between the adjacent elements so that the elements in one of the gate turn-off thyristor element pair and the diode element pair are located opposite to each other at the middle of the stack structure and are sandwiched by the associated elements in the other pair which are provided on both sides of the stack structure, respectively, and the resulting stack structure is clamped by a pair of clamper members.

With this construction, the GTO thyristor elements and the associated diode elements can be stacked without any intervening insulating members. As a result, the wiring length can be minimized to provide a small size of GTO thyristor stack that can minimize the wiring inductance between a GTO thyristor and an associated diode. Further, symmetrical balance of circuit impedance is provided.

The preferred embodiments of this invention will now be described in conjunction with the accompanying drawings, in which.

Figure 1:
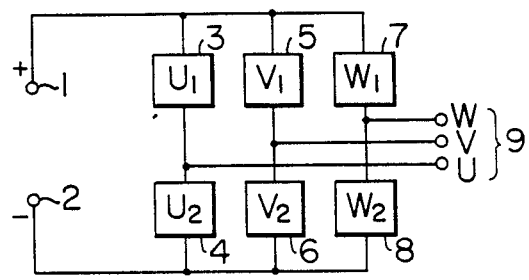
FIG. 1 is a schematic circuit diagram of a three-phase GTO thyristor inverter to which the invention can preferably be applied.

The invention may preferably be applied to a three-phase GTO thyristor inverter as schematically shown in FIG. 1. Connected between terminals 1 and 2 of a DC power source are arms or circuits 3 to 8 each having, as principal components, GTO thyristor circuits in parallel connection. The arms are termed $U_1$ and $U_2$, $V_1$ and $V_2$, and $W_1$ and $W_2$ corresponding to U, V and W phases at a three-phase AC terminal 9.

Figure 2:
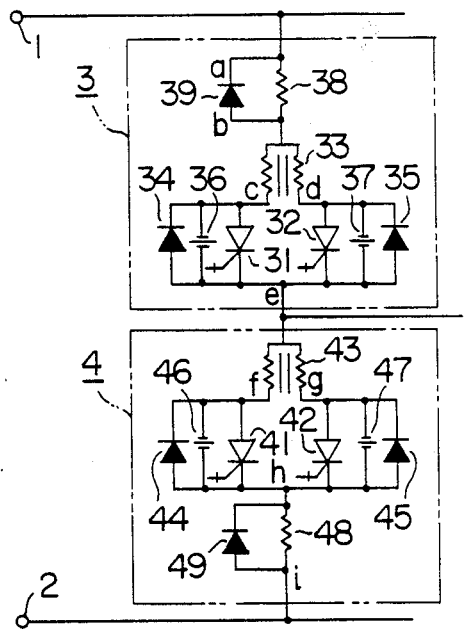
FIG. 2 is a circuit diagram showing a connection of a one-phase component of the inverter of FIG. 1.

FIG. 2 shows a circuit construction of a one-phase component of the inverter. A circuit of the $U_1$ arm 3, for example, comprises GTO thyristors 31 and 32 connected in parallel through a current balancer 33. The GTO thyristors 31 and 32 are respectively connected with diodes 34 and 35 in anti-parallel relationship and snubber capacitors 36 and 37 in parallel relationship. As well known in the art, the connection of the diodes 34 and 35 to the GTO thyristors is a direct one whereas the connection of the snubber capacitors 36 and 37 to the GTO thyristors is an indirect one in which a parallel connection of a diode and a resistor is usually inserted. The parallel GTO thyristor circuits are connected in series with a reactor 38 which is connected in parallel with a diode 39 and in back-to-back relationship with each of the GTO thyristors 31 and 32. The $U_2$ arm 4 is the same construction as the $U_1$ arm 3 excepting that the position of a parallel connection of a reactor 48 and a diode 49 is reversed. Although not illustrated, the components corresponding to V and W phases have each a similar circuit construction.

Figure 3:
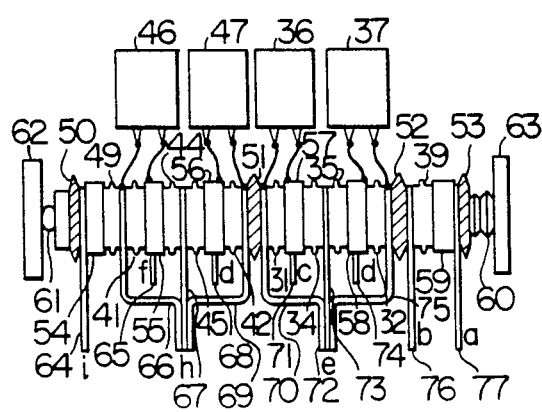
FIG. 3 is a plan view of a GTO thyristor stack incorporating the FIG. 2 component in accordance with one embodiment of the invention.

FIG. 3 shows one embodiment of a GTO thyristor stack in accordance with the invention, with the same elements as those in FIG. 2 designated by the same reference numerals. As shown, the stack also comprises insulating plates 50 to 53, electrically conductive heat sinks 54 to 59, a compression spring 60, a steel ball 61, clampers 62 and 63, and connecting conductors 64 to 77.

Taking the $U_1$ arm 3, for instance, a pair of diodes 34 and 35 in anti-parallel connection relationship with the GTO thyristors 31 and 32 are stacked in the middle of the stack structure with the connecting conductor 73 interposed. The GTO thyristors 31 and 32 are stacked on the opposite sides of the paired diodes 34 and 35 through the intervening heat sinks 57 and 58. Thus, the diodes 34 and 35 are sandwiched by the GTO thyristors 31 and 32. The GTO thyristors 31 and 32 have outer sides electrically connected to the connecting conductors 70 and 75. These conductors are connected to the conductor 73 electrically connected in common to the diodes 34 and 35, thus constituting a point e in FIG. 2. On the outside of the conductor 75 are stacked the insulating plate 52, conductor 76, diode 39, heat sink 59 and conductor 77 in succession.

The $U_2$ arm 4 has the same stacking as the $U_1$ arm 3 with the intervening insulating plate 51, with the only exception of elimination of an insulating plate between the conductor 66 and diode 49.

Figure 4:
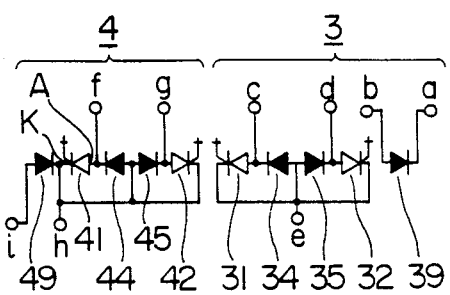
FIG. 4 is an electrical connection diagram of the stack of FIG. 3.

FIG. 4 shows the electrical connection of the FIG. 3 stack. Points a to i in FIG. 4 respectively correspond to those in FIGS. 2 and 3.

In the FIG. 3 embodiment, the stacking of the paired GTO thyristors in parallel connection and the diodes associated therewith in anti-parallel relationship does not require any insulating members. Accordingly, the number of lead conductors acting as terminals can be reduced as compared with a structure requiring insulating members, and the heat sink can belong in common to adjacent elements. Thus, the stack structure can be made compact, whereby the wiring length can be decreased to minimize the wiring inductance and, at the same time, the balance of impedance of electrical conductor wiring between two arms each having a GTO thyristor and a diode associated can be gained to get balance of current. Also, since the central diodes are sandwiched by two GTO thyristors, the length of wirings to the snubber capacitors 36, 37 and 46, 47 of a relatively large size can be reduced as shown in FIG. 3. As previously described, the capacitor is usually connected to the GTO thyristor via a parallel connection of a diode and a resistor not shown in this figure. As a result, even if the stack structure is combined with the capacitors of large capacity in consideration of switching speed, that is, di/dt of the GTO thyristors and the heat sinks of small size that are cooled with freon, the wiring inductance can be minimized without increasing the length of wirings between the GTO thyristors and the capacitors.

Generally, the GTO thyristor element is constructed such that its thermal resistance is lower on the anode A side than on the cathode K side so that most of generated heat is dissipated through the anode A. The anti-parallel diode, on the other hand, has usually larger tolerance in terms of current capacity than the GTO thyristor. In other words, the GTO thyristor typically has a smaller current capacity than the packaged diode of the same size and hence it is satisfied with cooling of one side surface. In view of the above, the heat sink having one side surface in contact with the anode of the GTO thyristor and the other side surface in contact with the diode as shown in FIGS. 3 and 4 succeeds in reducing itself in number.

Figure 5:
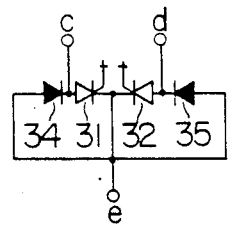
FIG. 5 is a fragmentary electrical connection diagram similar to FIG. 4 but for explaining a GTO thyristor stack in accordance with a further embodiment of the invention.

FIG. 5 shows an electrical connection of a further embodiment of a GTO thyristor stack in accordance with the invention. As shown therein, a pair of flat type GTO thyristors may be stacked in the middle of the stack structure and sandwiched by diodes in anti-parallel connection.

Figure 6:
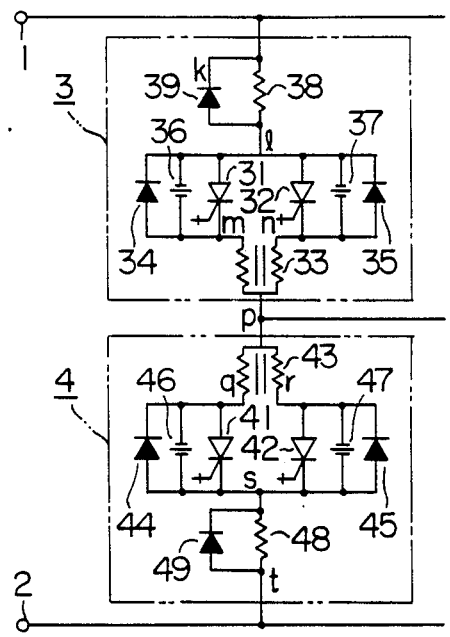
FIG. 6 is a circuit diagram of another connection of the one-phase component of the inverter of FIG. 1.
Figure 7:
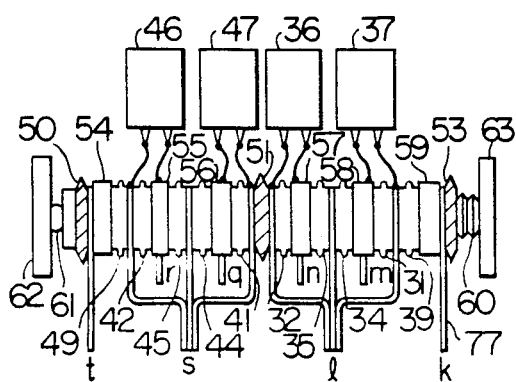
FIG. 7 is a plan view of a GTO thyristor stack incorporating the FIG. 6 component in accordance with a still further embodiment of the invention.
Figure 8:
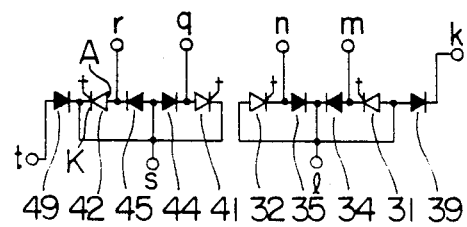
FIG. 8 is an electrical connection diagram of the stack of FIG. 7.

FIGS. 6, 7 and 8, similar to FIGS. 2, 3 and 4, show a still further embodiment of a GTO thyristor stack in accordance with the invention, in which the same elements as those in FIGS. 2, 3 and 4 are designated by the same reference numerals and will not be detailed.

What is different from the previous embodiment is that the position of a current balancer 43 is shifted toward a point P representative of an AC terminal. This connection permits elimination of an insulating member between a diode 39 and a GTO thyristor 31 as shown in FIGS. 7 and 8.

We claim:

1. A gate turn-off thyristor stack comprising:
   a set of two flat type gate turn-off thyristor elements and a set of two diode elements which sets are stacked with a stacking structure in which the two elements in one set of said thyristor and diode element sets are located at the middle of the stacking structure and sandwiched between the two elements of the other set, said stacking structure having means for electrically connecting said two thyristor elements in parallel with each other and elecrically connecting said two diode elements in antiparallel with said two thyristor elements respectively; and
   a pair of clamper members provided through insulating members at opposite outer sides of said stacking structure respectively for clamping said stacking structure.

2. A gate turn-off thyristor stack according to claim 1, wherein said thyristor and diode elements are stacked together with an electrically conductive heat dissipating member interposed only between the antiparallel-connected diode and thyristor elements.

3. A gate turn-off thyristor stack comprising:
   two circuits each including a set of two gate turn-off thyristor elements and a set of two diode elements which sets are stacked with a stacking structure in which the two elements in one set of said thyristor and diode element sets are located at the middle of the stacking structure and sandwiched between the two elements of the other set, said stacking structure having means for electrically connecting the two thyristor elements in parallel with each other and electrically connecting the two diode elements in antiparallel with the two thyristor elements respectively, said two circuits being series-assembled through a first insulating member interposed therebetween; and
   a pair of clamper members provided through second insulating members at opposite outer sides of the series-assembly of said two circuits respectively for clamping said assembly.

4. A gate turn-off thyristor stack according to claim 3, wherein each of said two circuits includes a semiconductor element which is other than said thyristor and diode elements and is electrically associated with that circuit, said two circuits being series-assembled together with said other semiconductor elements.

5. A gate turn-off thyristor stack according to claim 3, wherein the thyristor and diode elements in each of said two circuits are stacked together with an electrically conductive heat dissipating member disposed on only one of opposite side surfaces of each of the two thyristor elements in that circuit.

* * * * *